(12) United States Patent
Yen et al.

(10) Patent No.: US 9,178,088 B2
(45) Date of Patent: Nov. 3, 2015

(54) APPARATUS AND METHODS FOR FABRICATING SOLAR CELLS

(71) Applicant: TSMC SOLAR LTD., Taichung (TW)

(72) Inventors: Wen-Tsai Yen, Caotun Township, TN (US); Jyh-Lih Wu, Tainan (TW); Wei-Lun Xu, Taipei (TW); Chung-Hsien Wu, Luzhu Township (TW)

(73) Assignee: TSMC Solar Ltd., Taichung (TW)

( * ) Notice: Subject to any disclaimer, the term of this patent is extended or adjusted under 35 U.S.C. 154(b) by 236 days.

(21) Appl. No.: 14/025,852

(22) Filed: Sep. 13, 2013

(65) Prior Publication Data

US 2015/0079717 A1    Mar. 19, 2015

(51) Int. Cl.
*H01L 21/00* (2006.01)
*H01L 31/032* (2006.01)
*H01L 31/18* (2006.01)

(52) U.S. Cl.
CPC .......... *H01L 31/0322* (2013.01); *H01L 31/186* (2013.01)

(58) Field of Classification Search
CPC .............. H01L 31/0322; H01L 31/186; H01L 31/1864; H01L 31/1876
USPC ........................ 438/57, 73; 136/252, 260, 265
See application file for complete search history.

(56) References Cited

U.S. PATENT DOCUMENTS

| | | | | |
|---|---|---|---|---|
| 4,330,680 A | * | 5/1982 | Goetzberger | 136/247 |
| 2011/0272020 A1 | * | 11/2011 | Biro et al. | 136/256 |
| 2014/0357010 A1 | * | 12/2014 | Lu et al. | 438/57 |

* cited by examiner

*Primary Examiner* — Kevin M Picardat
(74) *Attorney, Agent, or Firm* — Duane Morris LLP (57) ABSTRACT

A method for fabricating a solar cell generally comprises delivering a solar cell substructure to a chamber. Electromagnetic radiation is generated using a wave generating device that is coupled to the chamber such that the wave generating device is positioned proximate to the solar cell substructure. The electromagnetic radiation is applied onto at least a portion of the solar cell substructure to facilitate the diffusion of at least one metal element through at least a portion of the solar cell substructure such that a semiconductor interface is formed between at least two different types of semiconductor materials of the solar cell substructure.

20 Claims, 6 Drawing Sheets

APPARATUS AND METHODS FOR FABRICATING SOLAR CELLS

FIELD

The disclosure relates to solar cells and, more particularly, to an apparatus and method for fabricating solar cells.

BACKGROUND

Photovoltaic cells or solar cells are photovoltaic components for direct generation of electrical current from sunlight. Due to the growing demand for clean sources of energy, the manufacture of solar cells has expanded dramatically in recent years and continues to expand. Solar cells include a substrate, a back contact layer on the substrate, an absorber layer on the back contact layer, a buffer layer on the absorber layer, and a front contact layer above the buffer layer. The layers can be applied onto the substrate during a deposition process using, for example, sputtering and/or co-evaporation.

Semi-conductive materials are used in the manufacturing or fabrication of at least some known solar cells by being used as the material to form at least a portion of the absorber layer. For example, chalcopyrite based semi-conductive materials, such as copper indium gallium sulfur-selenide (CIGSS) (also known as thin film solar cell materials), are used to complete the formation of the absorber layer after the deposition process. Some techniques that are used for the formation of CIGSS or thin film solar cell materials include a selenization process of metal precursors and a sulfurization process that is conducted after the selenization (the entire process is referred to as sulfurization after selenization (SAS)).

A semiconductor interface, such as a p/n junction, is formed between at least two different types of semiconductor materials of the solar cell substructure. For example, the p/n junction can be formed between two layers of the solar cell such that the p/n junction is buried within the chalcopyrite based semi-conductive materials. Two methods are used to the enhance and/or to facilitate the formation of the p/n junction inside the chalocopyrite based semi-conductive materials. One method is to add a stage during the deposition process, such as during the last stage of the co-evaporation process, for the formation of a surface layer. The surface layer undergoes a copper cation diffusion process for the underlying copper-rich layer and forms a copper-poor layer at the surface. This diffusion process enables the surface layer to have increased cation vacancies that can be beneficial for the later cation diffusion process to form a buried p/n junction. The other method includes the dissolution of a copper metal component of an absorber and the diffusion of a cation, such as cadmium and/or zinc, during a chemical bath deposition (CBD) process.

DETAILED DESCRIPTION

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

This description of the exemplary embodiments is intended to be read in connection with the accompanying drawings, which are to be considered part of the entire written description. The drawings are not drawn to scale. In the various drawings, like reference numerals indicate like items, unless expressly indicated otherwise in the text.

As described above, during fabrication of a solar cell, two methods are used to enhance and/or facilitate the formation of a semiconductor interface, such as a p/n junction, between two layers of the solar cell such that the interface is buried within portions of chalcopyrite based semi-conductive materials, such as copper indium gallium sulfur-selenide (CIGSS). One method adds a stage during the deposition process to facilitate the formation of a surface layer, wherein the surface layer has increased cation vacancies that are beneficial for a later cation diffusion process to form a buried p/n junction. However, such a process is not efficient for manufacturing on a large scale. The other method includes the dissolution of a copper metal component of an absorber and diffusion of a cation, such as cadmium and/or zinc. However, the dissolution is not efficient and hard to control.

The exemplary apparatus and methods described herein facilitate enhancing and/or forming a semiconductor interface, such as a p/n junction, using a controlled technique that is efficient and can be used for manufacturing on a large scale. For example, the apparatus and methods described herein includes the use of a wave generating device that is coupled to a chamber. The wave generating device generates electromagnetic radiation, such as microwaves, that can be applied to a solar cell substructure to facilitate the diffusion of at least one metal element through at least a portion of the substructure, such that the semiconductor interface can be formed between at least two different types of semiconductor materials of the substructure.

In some embodiments, the electromagnetic radiation can be applied to an absorber layer of the substructure prior to a buffer layer being deposited onto the absorber layer. Alternatively, in some embodiments, the electromagnetic radiation can be applied to the substructure after the buffer layer has been deposited onto the absorber layer. In some embodiments, the apparatus and methods described herein facilitate using the wave generating device to enhance the annealing of the layers of the solar cell substructure. For example, in some embodiments, the wave generating device is used to selectively apply electromagnetic radiation, such as microwaves, onto the substructure after the buffer layer has been deposited onto the absorber layer and after a front contact layer has been deposited onto the buffer layer.

Figure 1:
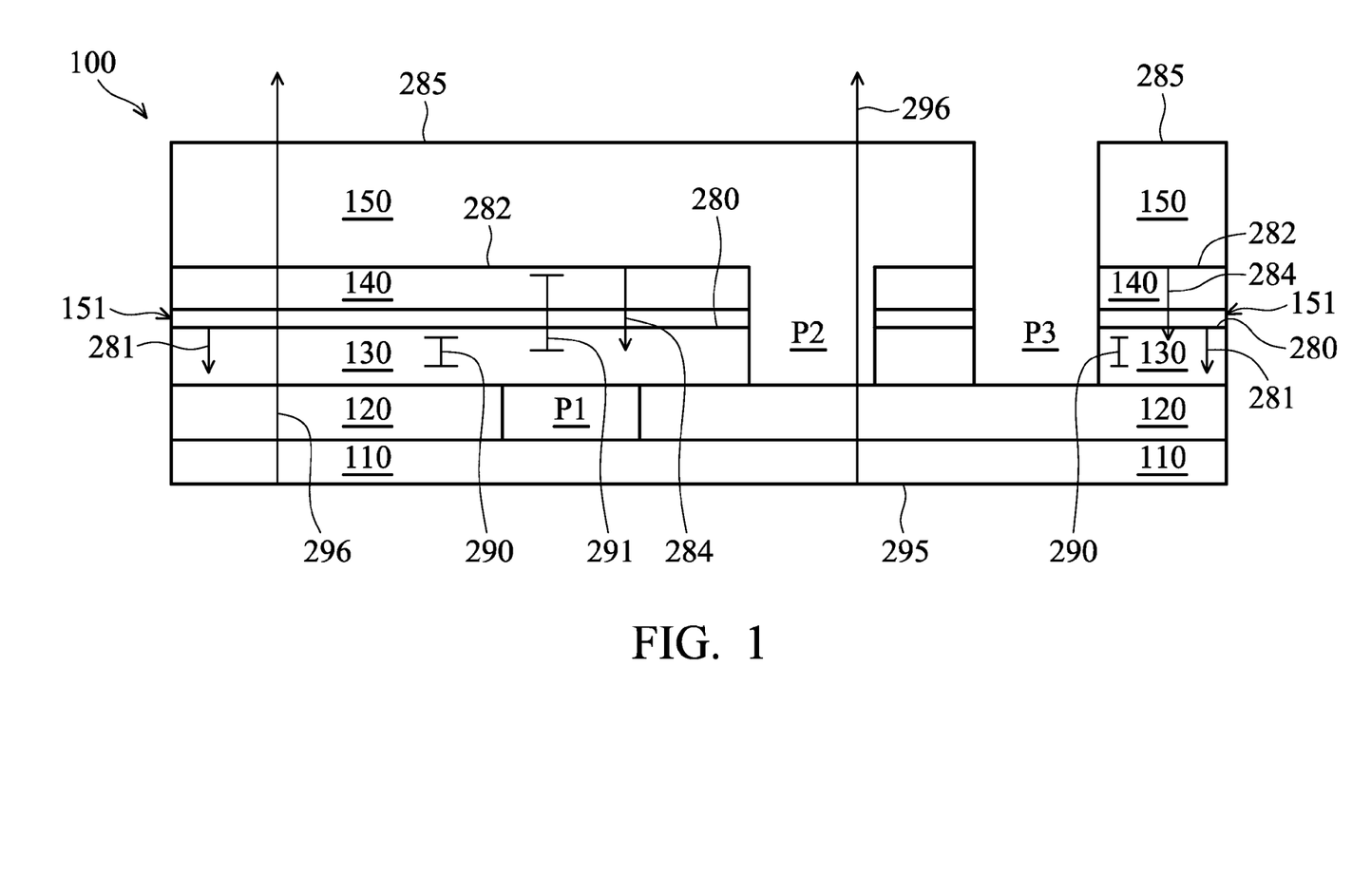
FIG. 1 is a cross-sectional view of an exemplary solar cell.

FIG. 1 illustrates a cross-section of a solar cell 100. Solar cell 100 includes a substrate 110, a back contact layer 120 formed onto substrate 110, a precursor layer that eventually becomes an absorber layer 130 formed onto back contact layer 120, a buffer layer 140 formed onto absorber layer 130, and a front contact layer or transparent conductive oxide (TCO) layer 150 above buffer layer 140.

Substrate 110 can include any suitable substrate material, such as glass. In some embodiments, substrate 110 can include a glass substrate, such as soda lime glass, or a flexible metal foil or polymer (e.g., a polyimide, polyethylene terephthalate (PET), polyethylene naphthalene (PEN)). Other embodiments include still other substrate materials. Back contact layer 120 includes any suitable back contact material, such as metals. In some embodiments, back contact layer 120 can include molybdenum (Mo), platinum (Pt), gold (Au), silver (Ag), nickel (Ni), or copper (Cu). Other embodiments include still other back contact materials.

In some embodiments, absorber layer 130 includes any suitable absorber material, such as p-type semiconductors. In some embodiments, the absorber layer 130 can include a chalcopyrite-based material comprising, for example, $Cu(In,Ga)Se_2$ (CIGS), cadmium telluride (CdTe), $CuInSe_2$ (CIS), $CuGaSe_2$ (CGS), $Cu(In,Ga)Se_2$ (CIGS), $Cu(In,Ga)(Se,S)_2$ (CIGSS), CdTe or amorphous silicon. Other embodiments include still other absorber materials.

Buffer layer 140 includes any suitable buffer material, such as n-type semiconductors. In some embodiments, buffer layer 140 can include cadmium sulphide (CdS), zinc sulphide (ZnS), zinc selenide (ZnSe), indium (III) sulfide ($In_2S_3$), indium selenide ($In_2Se_3$), or $Zn_{1-x}Mg_xO$, (e.g., ZnO). Other embodiments include still other buffer materials.

In some embodiments, front contact layer 150 includes an annealed TCO layer. The TCO material for the annealed TCO layer can include any suitable front contact material, such as metal oxides and metal oxide precursors. In some embodiments, the TCO material can include zinc oxide (ZnO), cadmium oxide (CdO), indium oxide ($In_2O_3$), tin dioxide ($SnO_2$), tantalum pentoxide ($Ta_2O_5$), gallium indium oxide ($GaInO_3$), ($CdSb_2O_3$), or indium oxide (ITO). The TCO material can also be doped with a suitable dopant. In some embodiments, ZnO can be doped with any of aluminum (Al), gallium (Ga), boron (B), indium (In), yttrium (Y), scandium (Sc), fluorine (F), vanadium (V), silicon (Si), germanium (Ge), titanium (Ti), zirconium (Zr), hafnium (Hf), magnesium (Mg), arsenic (As), or hydrogen (H). In other embodiments, $SnO_2$ can be doped with antimony (Sb), F, As, niobium (Nb), or tantalum (Ta). In other embodiments, $In_2O_3$ can be doped with tin (Sn), Mo, Ta, tungsten (W), Zr, F, Ge, Nb, Hf, or Mg. In other embodiments, CdO can be doped with In or Sn. In other embodiments, $GaInO_3$ can be doped with Sn or Ge. In other embodiments, $CdSb_2O_3$ can be doped with Y. In other embodiments, ITO can be doped with Sn. Other embodiments include still other TCO materials and corresponding dopants.

Solar cell 100 also includes interconnect structures that include three scribe lines, referred to as P1, P2, and P3. The P1 scribe line extends through the back contact layer 120 and is filled with the absorber layer material. The P2 scribe line extends through the buffer layer 140 and the absorber layer 130 and is filled with the front contact layer material. The P3 scribe line extends through the front contact layer 150, buffer layer 140 and absorber layer 130.

A semiconductor interface, such as p/n junction 151, is formed between buffer layer 140 and absorber layer 130, wherein p/n junction 151 can be a homojunction or a heterojunction. As described in more detail below with respect to the remaining figures, p/n junction 151 is enhanced and/or formed by the use of electromagnetic radiation, such as microwaves. The electromagnetic radiation is also used enhance the annealing of the layers of solar cell 100.

Figure 2:
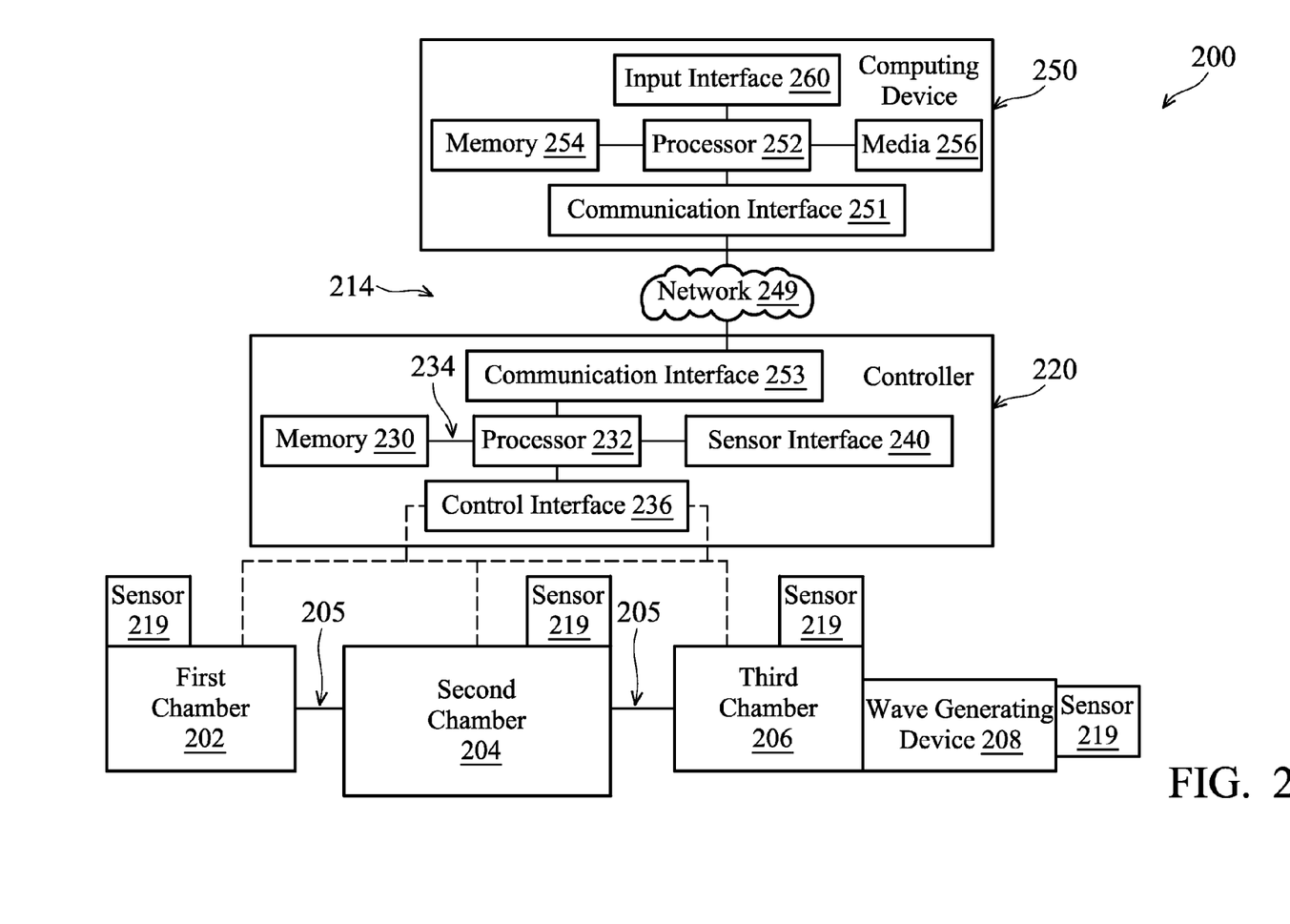
FIG. 2 is a block diagram of an exemplary apparatus used for fabricating the solar cell shown in FIG. 1.

FIG. 2 is a block diagram of an exemplary apparatus 200 used for the fabrication of solar cell 100 (shown in FIG. 1). In some embodiments, apparatus 200 includes a first chamber 202 that is configured to receive a substrate, such as substrate 110 (shown in FIG. 1), and to prepare substrate 110 therein for further processing. For example, first chamber 202 can include a vacuum source (not shown), a heater (not shown), and/or a heat exchanger (not shown) to facilitate providing heat energy to substrate 110, such that substrate is heated and ready to undergo further processing. A second chamber 204 is coupled to first chamber 202, via, for example, an endless conveyor 205, and second chamber 204 is configured to receive substrate 110 from first chamber 202 via endless conveyor 205.

In some embodiments, second chamber 204 is configured to deposit a layer, such as back contact layer 120 (shown in FIG. 1), buffer layer 140 (shown in FIG. 1), or a precursor layer that becomes absorber layer 130 (shown in FIG. 1), onto substrate 110 to form solar cell 100 or a substructure of solar cell 100. As such, second chamber 204 can include, for example, a vacuum pump or vacuum port (not shown), a heater (not shown), and/or a heat exchanger (not shown) to facilitate various deposition processes therein, such as sputtering and/or evaporation. In some embodiments, second chamber 204 is a sputter chamber. In other embodiments, second chamber 204 includes CBD equipment or is a MOCVD chamber. In some embodiments, second chamber 204 is not present in apparatus 200.

Apparatus 200 also includes a third chamber 206 that is coupled to second chamber 204 via endless conveyor 205. In some embodiments, third chamber 206 is configured to conduct a post-processing of the formed substructure, such as completing the formation of the precursor layer. For example, third chamber 206 can also include inert gases, such as nitrogen gas, argon, and helium, as well as hydrogen selenide and hydrogen sulfide such that third chamber 206 can conduct a selenization process and a sulfurization process after the selenization process (SAS). In some embodiments, for example, when second chamber 204 is not present in apparatus 200, third chamber 206 is an SAS chamber.

A wave generating device 208 is coupled to third chamber 206 such that wave generating device 208 is positioned proximate to a substructure of solar cell 100 when the substructure is received by third chamber 206. In some embodiments, wave generating device 208 is an isolator or microwave source that is configured to generate electromagnetic radiation, such as radio waves having wavelengths with frequencies in range of between about 30 MHz and about 30 GHz. Examples of suitable microwave sources can include a magnetron, klystron, traveling-wave tube (TWT), gyrotron, field-effect transistor, tunnel diodes, Gunn diodes, and IMPact ionization Avalanche Transit-Time (IMPATT) diodes. Wave generating device 208 is also configured to apply the electromagnetic radiation onto a substructure of solar cell 100 when third chamber 206 receives the substructure from second chamber 204.

In some embodiments, a control system 214 is coupled to each of the chambers within apparatus 200, and control system 214 is configured to control various operational parameters, such as temperature and pressure, within each of the chambers. In some embodiments, control system 214 includes a controller 220 that is operatively coupled to vary the operation of apparatus 200 as a function of values determined from sensors responsive to parameters such as temperature and pressure, as well as rates of change of such parameters, according to a programmed control scheme or algorithm. For example, in some embodiments, controller 220 is coupled to control at least one valve (not shown) in first chamber 202, at least one valve (not shown) in second chamber 204, and at least one valve (not shown) in third chamber 206, for example. Control system 214 is also configured to control wave generating device 208. For example, in some embodiments, controller 220 is coupled to an on/off switch (not shown) of wave generating device 208. As such, wave generating device 208 is controlled by controller 220 to selectively apply electromagnetic radiation to the substructure of solar cell 100. In some embodiments, controller 220 is enabled to facilitate operative features of each of the valves and/or the on/off switch, via features that include, without limitation, receiving inputs, transmitting outputs, and transmitting opening and closing commands and on and off commands.

In some embodiments, controller 220 can be a real-time controller and can include any suitable processor-based or microprocessor-based system, such as a computer system, that includes microcontrollers, reduced instruction set computer (RISC), an embedded microprocessor, application-specific integrated circuits (ASICs), logic circuits, and/or any other circuit or processor that is capable of executing the functions described herein. In one embodiment, controller 120 can be a microprocessor that includes read-only memory (ROM) and/or random access memory (RAM), such as, for example, a 32 bit microcomputer with 2 Mbit ROM and 64 Kbit RAM. As used herein, the term "real-time" refers to outcomes occurring in a substantially short period of time after a change in the inputs affect the outcome, with the time period being a design parameter that can be selected based on the importance of the outcome and/or the capability of the system processing the inputs to generate the outcome.

In some embodiments, controller 220 includes a memory device 230 that stores executable instructions and/or one or more operating parameters representing and/or indicating an operating condition of first chamber 202, second chamber 204, third chamber 206, and/or wave generating device 208. Controller 220 also includes a processor 232 that is coupled to memory device 230 via a system bus 234. In some embodiments, processor 232 can include a processing unit, such as, without limitation, an integrated circuit (IC), an application specific integrated circuit (ASIC), a microcomputer, a programmable logic controller (PLC), and/or any other programmable circuit. Alternatively, processor 232 can include multiple processing units (e.g., in a multi-core configuration). The above examples are exemplary only, and thus are not intended to limit in any way the definition and/or meaning of the term "processor."

In some embodiments, controller 220 includes a control interface 236 that is coupled to first chamber 202, second chamber 204, third chamber 206, and wave generating device 208. For example, control interface 236 is coupled to components, such as the valves within first chamber 202, second chamber 204, and third chamber 206, and the on/off switch of wave generating device 208. Control interface 236 is also configured to control an operation of the valves and the on/off switch. For example, processor 232 can be programmed to generate one or more control parameters that are transmitted to control interface 236. Control interface 236 can then transmit a control parameter to modulate, open, or close the valves, for example, or to modulate the on/off switch of wave generating device 208.

Various connection protocols are available between control interface 236 and first chamber 202, second chamber 204, third chamber 206, and wave generating device 208. Such connection protocols can include, without limitation, an electrical conductor, a low-level serial data connection, such as Recommended Standard (RS) 232 or RS-485, a high-level serial data connection, such as USB, a field bus, a "PROFI-BUS®," or Institute of Electrical and Electronics Engineers (IEEE) 1394 (a/k/a FIREWIRE), a parallel data connection, such as IEEE 1284 or IEEE 488, a short-range wireless communication channel (personal area network) such as "BLUETOOTH," and/or a private (e.g., inaccessible outside system) network connection, whether wired or wireless. "PROFIBUS" is a registered trademark of Profibus Trade Organization of Scottsdale, Ariz. IEEE is a registered trademark of the Institute of Electrical and Electronics Engineers, Inc., of New York, N.Y. "BLUETOOTH" is a registered trademark of Bluetooth SIG, Inc. of Kirkland, Wash.

In some embodiments, control system 214 also includes sensors 219 that are coupled to first chamber 202, second chamber 204, third chamber 206, and wave generating device 208. For example, in some embodiments, controller 220 includes a sensor interface 240 that is communicatively coupled to sensors 219. In some embodiments, sensors 219 are configured to detect various operating parameters, such as temperature and/or pressure, within each of the first chamber 202, second chamber 204, and third chamber 206. Sensors 219 can also detect whether electromagnetic radiation is being emitted from wave generating device 208. Sensors 219 each transmit a signal corresponding to their respective detected parameters to controller 220. Sensors 219 can each transmit a signal continuously, periodically, or only once, for example. In other embodiments, different bases are used for signal timings. Furthermore, sensors 219 can each transmit a signal either in an analog form or in a digital form. Various connections are available between sensor interface 240 and sensors 219. Such connections can include, without limitation, an electrical conductor, a low-level serial data connection, such as RS 232 or RS-485, a high-level serial data connection, such as USB or IEEE® 1394, a parallel data connection, such as IEEE® 1284 or IEEE® 488, a short-range wireless communication channel such as BLUETOOTH®, and/or a private (e.g., inaccessible outside system) network connection, whether wired or wireless.

Control system 214 can also include a user computing device 250 that is coupled to controller 220 via a network 249. For example, computing device 250 includes a communication interface 251 that is coupled to a communication interface 253 contained within controller 220. User computing device 250 includes a processor 252 for executing instructions. In some embodiments, executable instructions are stored in a memory device 254. Processor 252 can include one or more processing units (e.g., in a multi-core configuration). Memory device 254 is any device allowing information, such as executable instructions and/or other data, to be stored and retrieved. User computing device 250 also includes at least one media output component 256 for use in presenting information to a user. Media output component 256 is any component capable of conveying information to the user. Media output component 256 can include, without limitation, a display device (not shown) (e.g., a liquid crystal display (LCD), an organic light emitting diode (OLED) display, or an audio output device (e.g., a speaker or headphones)).

In some embodiments, user computing device 250 includes an input interface 260 for receiving input from a user. Input interface 260 can include, for example, a keyboard, a pointing device, a mouse, a stylus, a touch sensitive panel (e.g., a touch pad or a touch screen), a gyroscope, an accelerometer, a position detector, and/or an audio input device. A single component, such as a touch screen, can function as both an output device of media output component 256 and input interface 260.

During operation of apparatus 200, substrate 110 is delivered to first chamber 202, via endless conveyor 205, wherein substrate 110 is heated in preparation for further processing. Substrate 110 is conveyed on endless conveyor 205 from first chamber 202 to second chamber 204, wherein layers can be deposited onto substrate 110 via processes, such as sputtering and/or evaporation. For example, back contact layer 120 can be sputtered onto substrate 110 and the precursor layer can then be formed onto back contact layer 120 by sputtering and/or co-evaporation. The substructure formed in second chamber 204 is then conveyed on endless conveyor 205 from second chamber 204 to third chamber 206, wherein the absorber formation is completed by undergoing SAS.

As explained in more detail below with respect to FIGS. 3 and 4, when undergoing SAS in third chamber 206, the substructure of solar cell 100 can receive electromagnetic radiation from wave generating device 208. For example, in some embodiments, electromagnetic radiation is applied to the precursor layer prior to buffer layer 140 being deposited onto the precursor layer. Alternatively, in some embodiments, the electromagnetic radiation can be applied to the substructure of solar cell 100 after buffer layer 140 has been deposited onto the precursor layer.

As explained in more detail below with respect to FIG. 5, in some embodiments, electromagnetic radiation is selectively applied onto the substructure of solar cell 100 after buffer layer 140 has been deposited onto the precursor layer and after front contact layer 150 (shown in FIG. 1) has been deposited onto buffer layer 140 to facilitate the annealing of the layers of the substructure of solar cell 100. Accordingly, applying the electromagnetic radiation onto the substructure of solar cell 100 is a controllable and efficient technique used to facilitate enhancing and/or forming a semiconductor interface, such as p/n junction 151 (shown in FIG. 1), within solar cell 100 and/or to facilitate annealing. Moreover, such a technique can be used for large-scale manufacturing.

Figure 3:
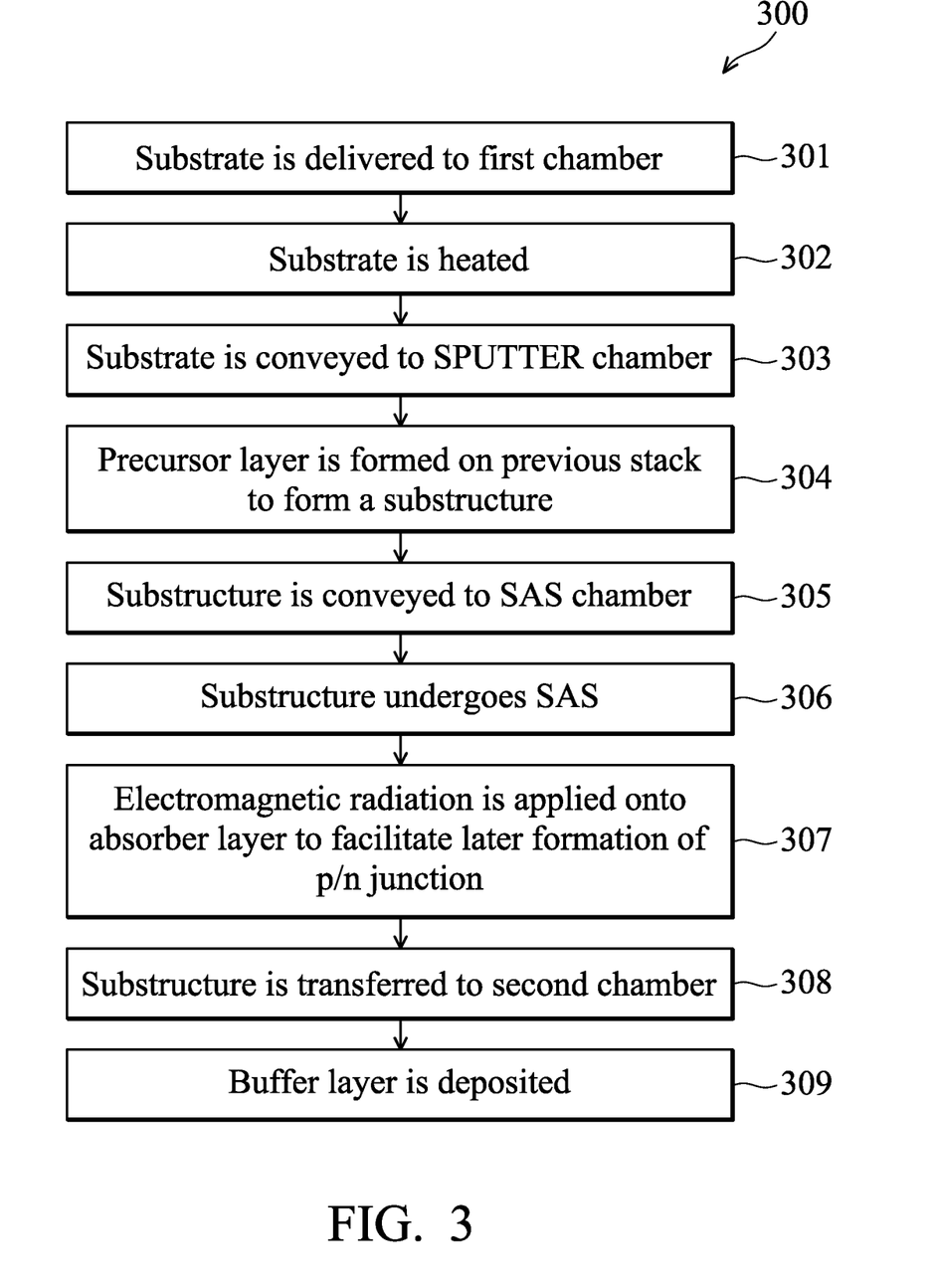
FIG. 3 is a flow diagram of an exemplary method for fabricating the solar cell using the apparatus shown in FIG. 2.

FIG. 3 is a flow diagram 300 of an exemplary method for fabricating solar cell 100 (shown in FIG. 1) by using apparatus 200 (shown in FIG. 2).). In step 301, substrate 110 (shown in FIG. 1) is delivered to first chamber 202 (shown in FIG. 2), via endless conveyor 205 (shown in FIG. 2), wherein substrate 110 is heated in preparation for further processing in step 302. In some embodiments, steps 301 and 302 are optional and can be excluded from the method.

In step 303, substrate 110 is conveyed on endless conveyor 205 from first chamber 202 to second chamber 204 (shown in FIG. 2), such as a sputter chamber. In step 303, a precursor layer is deposited onto substrate 110 or previous stack of layers on substrate 110 to form a substructure via processes, such as sputtering and/or evaporation.

In step 305, the substructure is conveyed on endless conveyor 205 from second chamber 204 to third chamber 206 (shown in FIG. 2), such as an SAS chamber, wherein the precursor layer formation is completed by undergoing the SAS process in step 306 such that chalcopyrite based semiconductive materials, such as copper indium gallium sulfur-selenide (CIGSS) can be formed as part of the precursor layer. For example, metal elements, such as cadmium, indium, and/or copper can be deposited onto the precursor layer, along with selenium and/or sulfur using sputtering and/or evaporation and/or a chemical bath deposition (CBD) process.

During the SAS process, in step 307, electromagnetic radiation, such as microwaves, are applied onto a surface 280 (shown in FIG. 1) of the precursor layer via wave generating device 208 (shown in FIG. 2) such that the microwaves travel from surface 280 of the precursor layer through at least a portion of the precursor layer, as shown by arrows 281 (shown in FIG. 1). The electromagnetic radiation during the SAS process facilitates the diffusion of metal elements within at least a portion of the precursor layer. For example, in some embodiments, cadmium is diffused through surface 280 of the precursor layer to a distance 290 (shown in FIG. 1) of between about 5 nm to about 30 nm within the precursor layer. Moreover, the electromagnetic radiation facilitates the formation of a copper-poor phase at the CIGSS surface due to the migration or diffusion of the copper atoms. As such, p/n junction 151 (shown in FIG. 1) is formed and/or enhanced on top of the precursor layer.

In step 308, the substructure of solar cell 100 having p/n junction 151 formed on the precursor layer is transferred back to second chamber 204 or to a different second chamber (not shown). In step 309, buffer layer 140 (shown in FIG. 1) is deposited above p/n junction 151 using, for example, a CBD process.

In some embodiments, the electromagnetic radiation being emitted from wave generating device 208 can be controlled by a user. For example, a user can initially input a command to have wave generating device 208 emit the electromagnetic radiation. The command can be programmed with user computing device 250 (shown in FIG. 2) and/or controller 220 (shown in FIG. 2). Then controller 220 will transmit a control parameter to, for example, the on/off switch of wave generating device 208 such that the microwaves can be emitted onto the precursor layer. This same mechanism can be used to shut down wave generating device 208. Alternatively, wave generating device 208 can automatically emit the electromagnetic radiation. For example, sensor 219 (shown in FIG. 2), which is positioned on third chamber 206, can detect when a substructure has been received by third chamber 206 and transmit at least one signal representative of the detected substructure to controller 220. Controller 220 can transmit a control parameter to wave generating device 308 such that electromagnetic radiation is emitted onto the substructure.

Figure 4:
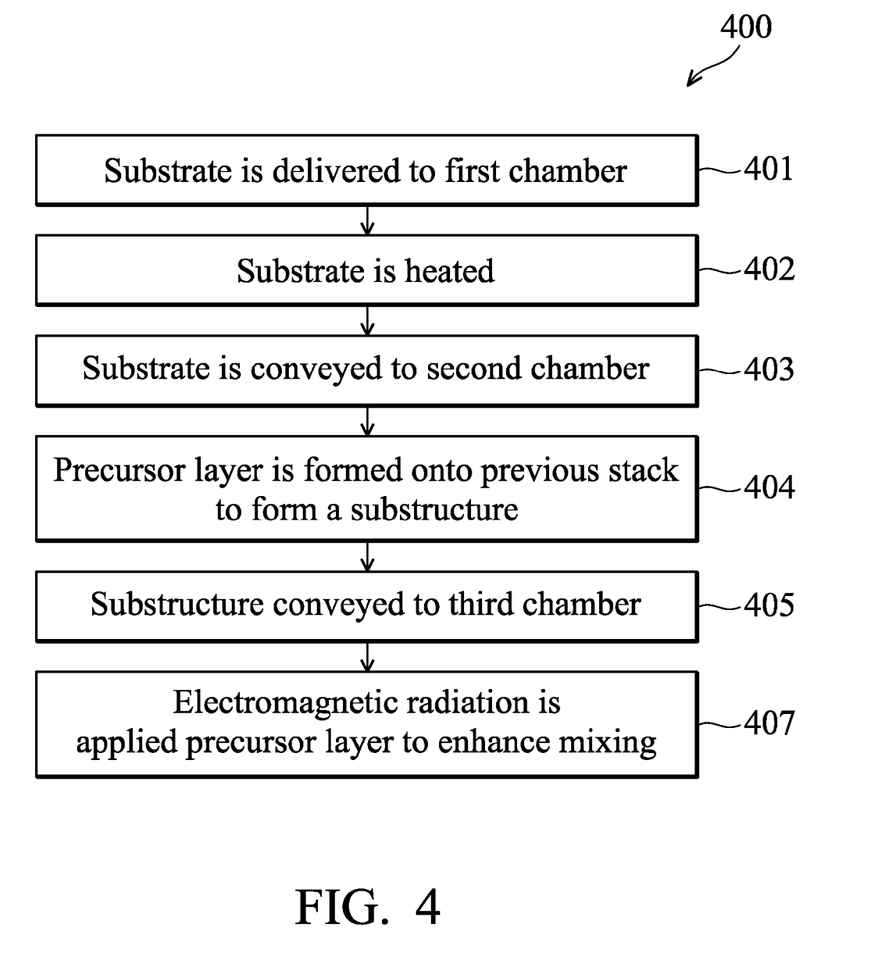
FIG. 4 is a flow diagram of an alternative method for fabricating the solar cell using the apparatus shown in FIG. 2.

FIG. 4 is a flow diagram 400 of an alternative method for fabricating solar cell 100 (shown in FIG. 1) using apparatus 200 (shown in FIG. 2) that can be used in place of the method shown in flow diagram 300 (shown in FIG. 3). In step 401, substrate 110 (shown in FIG. 1) is delivered to first chamber 202 (shown in FIG. 2), via endless conveyor 205 (shown in FIG. 2), wherein substrate 110 is heated in preparation for further processing in step 402. In some embodiments, steps 401 and 402 are optional and can be excluded from the method.

In step 403, substrate 110 is conveyed on endless conveyor 205 from first chamber 202 to second chamber 204 (shown in FIG. 2), wherein the precursor layer can be deposited onto substrate 110 to form a substructure in step 404, via processes, such as sputtering and/or evaporation and/or the CBD process.

In step 405, the substructure is conveyed on endless conveyor 205 from second chamber 204 to third chamber 206 (shown in FIG. 2), wherein the layer formations are completed by undergoing further processing in step 406.

While the substructure is undergoing further processing, in step 407, electromagnetic radiation, such as microwaves, are applied onto the precursor layer , as shown by arrows 284 (shown in FIG. 1), to enhance mixing. The electromagnetic radiation facilitates the diffusion of metal elements within at least a portion of buffer layer 140 and at least a portion of the precursor layer. For example, in some embodiments, cadmium is diffused through at least a portion of buffer layer 140 and the precursor layer to a distance 291 (shown in FIG. 1) of between about 5 nm to about 50 nm. Moreover, the electromagnetic radiation facilitates cadmium or zinc diffusion into the CIGSS films for the formation of p/n junction 151 (shown in FIG. 1), wherein the cadmium or zinc is from the cadmium sulfur or the zinc sulfur of buffer layer 140.

Figure 5:
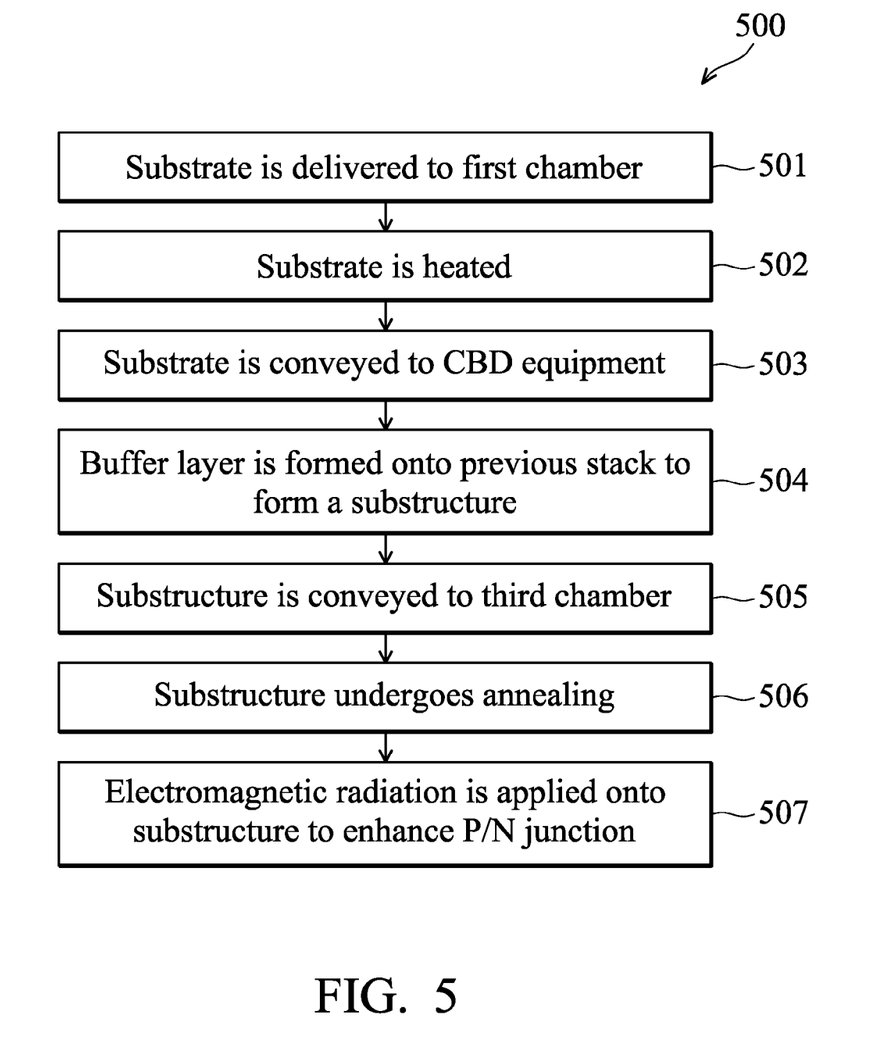
FIG. 5 is a flow diagram of another alternative method for fabricating the solar cell using the apparatus shown in FIG. 2.

FIG. 5 is a flow diagram 500 of an alternative method for fabricating solar cell 100 (shown in FIG. 1) using apparatus 200 (shown in FIG. 2) that can be used in place of the method shown in flow diagram 300 (shown in FIG. 3). In step 501, substrate 110 (shown in FIG. 1) is delivered to first chamber 202 (shown in FIG. 2), via endless conveyor 205 (shown in FIG. 2), wherein substrate 110 is heated in preparation for further processing in step 502. In some embodiments, steps 501 and 502 are optional and can be excluded from the method In step 503, substrate 110 is conveyed on endless conveyor 205 from first chamber 202 to second chamber 204 (shown in FIG. 2), such as to the CBD equipment, wherein buffer layer is formed onto previous stack of layers on substrate 110 to form a substructure in step 504 via processes, such as the CBD process.

In step 505, the substructure is conveyed on endless conveyor 205 from second chamber 204 to third chamber (shown in FIG. 2), wherein the layer formations are completed by undergoing an annealing process in step 506. During the annealing process, in step 507, electromagnetic radiation, such as microwaves, is applied onto the substructure via wave generating device 208 to enhance the p/n junction. For example, the electromagnetic radiation can be applied from a surface 295 (shown in FIG. 1) of substrate 110 such that the waves travel through substrate 110 and through a surface 285 (shown in FIG. 1) of front contact layer 150, as shown by arrows 296 (shown in FIG. 1). When the microwaves travel through each of the layers, the desired films can be heated by the waves. For example, in some embodiments, when the waves travel through each layer, each individual layer is applied with the heat. The electromagnetic radiation during the annealing process enables a relatively higher quality annealing end product, as heat is applied to the desired films. Moreover, by selectively applying heat, gallium can be diffused to the top of CIGSS absorbers, such as surface 280 (shown in FIG. 1) of the precursor layer, to achieve gallium homogenization (i.e., fast gallium interdiffusion).

Figure 6:
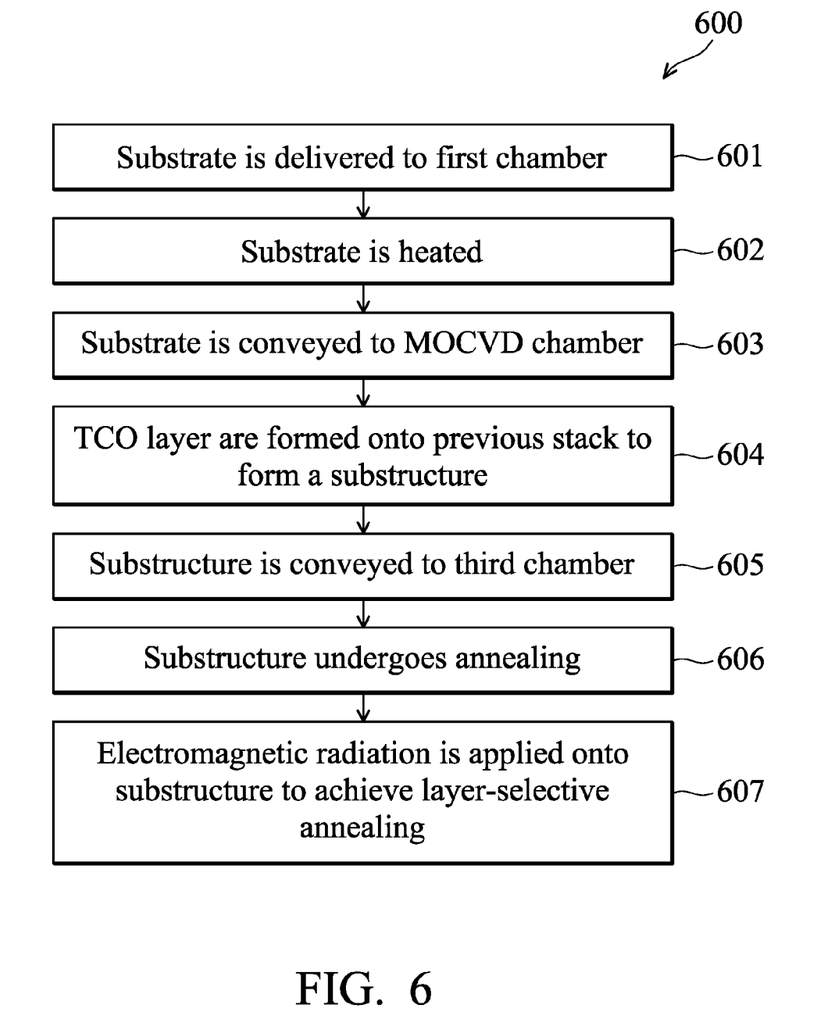
FIG. 6 is a flow diagram of another alternative method for fabricating the solar cell using the apparatus shown in FIG. 2.

FIG. 6 is a flow diagram 600 of an alternative method for fabricating solar cell 100 (shown in FIG. 1) using apparatus 200 (shown in FIG. 2) that can be used in place of the method shown in flow diagram 300 (shown in FIG. 3). In step 601, substrate 110 (shown in FIG. 1) is delivered to first chamber 202 (shown in FIG. 2), via endless conveyor 205 (shown in FIG. 2), wherein substrate 110 is heated in preparation for further processing in step 602. In some embodiments, steps 601 and 602 are optional and can be excluded from the method In step 603, substrate 110 is conveyed on endless conveyor 205 from first chamber 202 to second chamber 204 (shown in FIG. 2), such as to the MOCVD chamber, wherein a front contact layer or TCO layer (shown in FIG. 1) is formed onto previous stack of layers on substrate 110 to form a substructure in step 604 via known processes.

In step 605, the substructure is conveyed on endless conveyor 205 from second chamber 204 to third chamber (shown in FIG. 2), wherein the layer formations are completed by undergoing an annealing process in step 606. During the annealing process, in step 607, electromagnetic radiation, such as microwaves, is applied onto the substructure via wave generating device 208 to achieve layer-selective annealing.

Some embodiments described herein provide facilitate enhancing and/or forming a semiconductor interface, such as a p/n junction, using a controlled technique that is efficient and can be used for manufacturing on a large scale. For example, the apparatus and methods described herein includes the use of a wave generating device that is coupled to a third chamber. The wave generating device generates electromagnetic radiation, such as microwaves, that can be applied to a solar cell substructure to facilitate the diffusion of at least one metal element through at least a portion of the substructure such that the semiconductor interface can be formed between at least two different types of semiconductor materials of the substructure. In some embodiments, the electromagnetic radiation can be applied to an precursor layer of the substructure prior to a buffer layer being deposited onto the precursor layer. Alternatively, in some embodiments, the electromagnetic radiation can be applied to the substructure after the buffer layer has been deposited onto the precursor layer. In some embodiments, the apparatus and methods described herein facilitate using the wave generating device to enhance the annealing of the layers of the solar cell substructure. For example, in some embodiments, the wave generating device is used to selectively apply electromagnetic radiation, such as microwaves, onto the substructure after the buffer layer has been deposited onto the precursor layer and after a front contact layer has been deposited onto the buffer layer.

In some embodiments, a method for fabricating a solar cell is provided and includes delivering a solar cell substructure to a chamber. Electromagnetic radiation is generated using a wave generating device that is coupled to the chamber such that the wave generating device is positioned proximate to the solar cell substructure. The electromagnetic radiation is applied onto at least a portion of the solar cell substructure to facilitate the diffusion of at least one metal element through at least a portion of the solar cell substructure such that a semiconductor interface is formed between at least two different types of semiconductor materials of the solar cell substructure.

In some embodiments, an apparatus is provided. The apparatus includes a chamber that is configured to receive a solar cell substructure from at least one other chamber. A wave generating device is coupled to the chamber such that the wave generating device is positioned proximate to the solar cell substructure when the chamber receives the solar cell substructure. The wave generating device is configured to generate electromagnetic radiation and to apply the electromagnetic radiation onto at least a portion of the solar cell substructure to facilitate the diffusion of at least one metal element through at least a portion of the solar cell substructure.

In some embodiments, a method for fabricating a solar cell is provided. The method includes delivering a solar cell substructure to a chamber, wherein the solar cell substructure includes an precursor layer, a buffer layer on at least a portion of the precursor layer, and a front contact layer on at least a portion of the buffer layer. Electromagnetic radiation is generated using a wave generating device that is coupled to the chamber such that the wave generating device is positioned proximate to the solar cell substructure. The electromagnetic radiation is selectively applied onto at least a portion of the solar cell substructure such that the electromagnetic radiation travels through at least a portion of the precursor layer, the buffer layer, and the front contact layer to enable the diffusion of at least one metal element through at least a portion of the solar cell substructure.

Although the apparatus and methods described herein have been described in terms of exemplary embodiments, they are not limited thereto. Rather, the appended claims should be construed broadly, to include other variants and embodiments of the disclosed system and methods, which can be made by those skilled in the art without departing from the scope and range of equivalents of the system and methods.

What is claimed is:

1. A method for fabricating a solar cell, said method comprising:
    delivering a solar cell substructure to a chamber;
    generating electromagnetic radiation using a wave generating device coupled to the chamber such that the wave generating device is positioned proximate to the solar cell substructure; and
    applying the electromagnetic radiation onto at least a portion of the solar cell substructure to facilitate the diffusion of at least one metal element through at least a portion of the solar cell substructure such that a semiconductor interface is formed between at least two different types of semiconductor materials of the solar cell substructure.

2. The method of claim 1, wherein generating electromagnetic radiation comprises generating electromagnetic radiation that includes wavelengths with frequencies in a range from about 30 MHz to about 30 GHz.

3. The method of claim 1, wherein applying the electromagnetic radiation comprises applying the electromagnetic radiation onto at least a portion of the solar cell substructure, such that the at least one metal element is diffused through at least a portion of the solar cell substructure to a distance from about 5 nm to about 50 nm.

4. The method of claim 1, wherein applying the electromagnetic radiation comprises applying the electromagnetic radiation onto at least a portion of the solar cell substructure to facilitate the diffusion of one of cadmium, zinc, or gallium.

5. The method of claim 1, wherein delivering a solar cell substructure comprises delivering a solar cell substructure that includes a precursor layer.

6. The method of claim 5, wherein applying the electromagnetic radiation comprises applying the electromagnetic radiation onto at least a portion of the solar cell substructure such that the electromagnetic radiation travels through at least a portion of the precursor layer.

7. The method of claim 1, wherein delivering a solar cell substructure comprises delivering a solar cell substructure that includes an precursor layer and a buffer layer on at least a portion of the precursor layer.

8. The method of claim 7, wherein applying the electromagnetic radiation comprises applying the electromagnetic radiation onto at least a portion of the solar cell substructure such that the electromagnetic radiation travels through at least a portion of the precursor layer and the buffer layer.

9. An apparatus comprising:
    a chamber configured to receive a solar cell substructure from at least one other chamber; and
    a wave generating device coupled to said chamber such that said wave generating device is positioned proximate to the solar cell substructure when said chamber receives the solar cell substructure, wherein said wave generating device is configured to generate electromagnetic radiation and to apply the electromagnetic radiation onto at least a portion of the solar cell substructure to facilitate the diffusion of at least one metal element through at least a portion of the solar cell substructure.

10. The apparatus of claim 9, wherein said wave generating device is configured to generate electromagnetic radiation that includes wavelengths with frequencies in a range from about 30 MHz to about 30 GHz.

11. The apparatus of claim 9, wherein the at least one metal element is diffused through at least a portion of the solar cell substructure to a distance from about 5 nm to about 50 nm.

12. The apparatus of claim 9, wherein the at least one metal element includes one of cadmium, zinc, or gallium.

13. The apparatus of claim 9, wherein the solar cell substructure includes an precursor layer, said wave generating device is configured to apply the electromagnetic radiation onto at least a portion of the solar cell substructure such that the electromagnetic radiation travels through at least a portion of the precursor layer.

14. The apparatus of claim 9, wherein the solar cell substructure includes an precursor layer and a buffer layer on at least a portion of the precursor layer, said wave generating device is configured to apply the electromagnetic radiation onto at least a portion of the solar cell substructure such that the electromagnetic radiation travels through at least a portion of the precursor layer and the buffer layer.

15. The apparatus of claim 9, wherein the solar cell substructure includes an precursor layer, a buffer layer on at least a portion of the precursor layer, and a front contact layer on at least a portion of the buffer layer, said wave generating device is configured to selectively apply the electromagnetic radiation onto at least a portion of the solar cell substructure such that the electromagnetic radiation travels through at least a portion of the precursor layer, the buffer layer, and the front contact layer.

16. The apparatus of claim 15, wherein said wave generating device is configured to selectively apply the electromagnetic radiation onto at least a portion of the solar cell substructure such that the at least one metal element is diffused to a surface of the precursor layer.

17. A method for fabricating a solar cell, said method comprising:
    delivering a solar cell substructure to a chamber, wherein the solar cell substructure includes an precursor layer, a buffer layer on at least a portion of the precursor layer, and a front contact layer on at least a portion of the buffer layer;
    generating electromagnetic radiation using a wave generating device that is coupled to the chamber such that the wave generating device is positioned proximate to the solar cell substructure; and
    applying, selectively, the electromagnetic radiation onto at least a portion of the solar cell substructure such that the electromagnetic radiation travels through at least a portion of the precursor layer, the buffer layer, and the front contact layer to enable the diffusion of at least one metal element through at least a portion of the solar cell substructure.

18. The method of claim 17, wherein generating electromagnetic radiation comprises generating electromagnetic radiation that includes wavelengths with frequencies in range from about 30 MHz to about 30 GHz.

19. The method of claim 17, wherein applying, selectively, the electromagnetic radiation comprises applying, selectively, the electromagnetic radiation onto at least a portion of the solar cell substructure to enable the diffusion of gallium.

20. The method of claim 17, wherein applying, selectively, the electromagnetic radiation comprises applying, selectively, the electromagnetic radiation onto at least a portion of the solar cell substructure to enable the diffusion of gallium to a surface of the precursor layer.

* * * * *